United States Patent
Bi et al.

(10) Patent No.: US 10,573,566 B2
(45) Date of Patent: Feb. 25, 2020

(54) FABRICATION OF FIN FIELD EFFECT TRANSISTOR COMPLEMENTARY METAL-OXIDE-SEMICONDUCTOR DEVICES WITH UNIFORM HYBRID CHANNELS

(71) Applicant: INTERNATIONAL BUSINESS MACHINES CORPORATION, Armonk, NY (US)

(72) Inventors: Zhenxing Bi, Niskayuna, NY (US); Kangguo Cheng, Schenectady, NY (US); Peng Xu, Guilderland, NY (US); Jie Yang, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/148,433

(22) Filed: Oct. 1, 2018

(65) Prior Publication Data
US 2019/0035695 A1    Jan. 31, 2019

Related U.S. Application Data

(62) Division of application No. 15/593,958, filed on May 12, 2017, now Pat. No. 10,147,651.

(51) Int. Cl.
*H01L 29/10* (2006.01)
*H01L 21/8238* (2006.01)
(Continued)

(52) U.S. Cl.
CPC ........ *H01L 21/823878* (2013.01); *H01L 21/823431* (2013.01); *H01L 21/823821* (2013.01);
(Continued)

(58) Field of Classification Search
CPC ..... H01L 21/823431; H01L 21/823821; H01L 21/845; H01L 27/0886; H01L 27/0924;
(Continued)

(56) References Cited

U.S. PATENT DOCUMENTS

| 8,481,410 B1 | 7/2013 | LiCausi et al. |
| 8,497,171 B1 | 7/2013 | Wu et al. |

(Continued)

OTHER PUBLICATIONS

Wei et al., "Bulk FinFETs with body spacers for improving fin height variation," Solid-State Electronics. vol. 122. Aug. 2016. pp. 45-51.

(Continued)

*Primary Examiner* — Eduardo A Rodela
(74) *Attorney, Agent, or Firm* — Tutunjian & Bitetto, P.C.; Vazken Alexanian

(57) ABSTRACT

A method of forming complementary vertical fins and vertical fins with uniform heights, including, forming a trench in a region of a substrate, wherein the trench extends through an upper portion of the substrate and a buried punch-through stop layer, and extends into a lower portion of the substrate, forming a reformed punch-through stop layer in a bottom portion of the trench, forming a fin formation region on the reformed punch-through stop layer, and forming a complementary vertical fin from the fin formation region and a vertical fin from the upper portion of the substrate on a first region of the substrate adjacent to the second region.

18 Claims, 7 Drawing Sheets

(51) Int. Cl.
*H01L 27/092* (2006.01)
*H01L 29/165* (2006.01)
*H01L 21/8234* (2006.01)
*H01L 27/108* (2006.01)
*H01L 27/088* (2006.01)
*H01L 29/66* (2006.01)
*H01L 29/417* (2006.01)
*H01L 29/78* (2006.01)

(52) U.S. Cl.
CPC ...... *H01L 27/0886* (2013.01); *H01L 27/0924* (2013.01); *H01L 27/10879* (2013.01); *H01L 29/1083* (2013.01); *H01L 29/165* (2013.01); *H01L 29/41791* (2013.01); *H01L 29/66537* (2013.01); *H01L 29/66795* (2013.01); *H01L 29/66803* (2013.01); *H01L 29/785* (2013.01)

(58) Field of Classification Search
CPC ......... H01L 27/10826; H01L 27/10879; H01L 27/1211; H01L 29/0847; H01L 29/1083; H01L 29/66537; H01L 29/41791; H01L 29/7831; H01L 29/785
See application file for complete search history.

(56) References Cited

U.S. PATENT DOCUMENTS

| | | | |
|---|---|---|---|
| 8,993,399 | B2 | 3/2015 | Cheng et al. |
| 9,054,219 | B1 | 6/2015 | Hoffmann et al. |
| 9,082,853 | B2 | 7/2015 | Cheng et al. |
| 9,257,556 | B2 | 2/2016 | Xu et al. |
| 9,299,618 | B1 | 3/2016 | Cheng et al. |
| 9,343,371 | B1 * | 5/2016 | Wu ................. H01L 21/823821 |
| 9,378,948 | B2 | 6/2016 | Cheng et al. |
| 9,385,189 | B1 * | 7/2016 | Sung ................... H01L 29/0638 |
| 9,508,604 | B1 * | 11/2016 | Sung ............... H01L 21/823821 |
| 2014/0097518 | A1 | 4/2014 | Cheng et al. |
| 2015/0303284 | A1 | 10/2015 | Basker et al. |
| 2016/0307807 | A1 * | 10/2016 | Lim ............... H01L 21/823821 |
| 2017/0250183 | A1 * | 8/2017 | Brunco ............... H01L 27/0924 |

OTHER PUBLICATIONS

List of IBM Patents or Patent Applications Treated as Related dated Oct. 1, 2018, 2 pages.

* cited by examiner

US 10,573,566 B2

FABRICATION OF FIN FIELD EFFECT TRANSISTOR COMPLEMENTARY METAL-OXIDE-SEMICONDUCTOR DEVICES WITH UNIFORM HYBRID CHANNELS

BACKGROUND

Technical Field

The present invention generally relates to forming fin field effect transistors (FinFETs) with uniform hybrid channels for forming complementary metal-oxide-semiconductor (CMOS) devices, and more particularly to reforming a punch-through stop layer and fin formation region in the substrate to form uniform hybrid channels.

Description of the Related Art

A Field Effect Transistor (FET) typically has a source, a channel, and a drain, where current flows from the source to the drain, and a gate that controls the flow of current through the channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin approximately rectangular Si, commonly referred to as the fin with a gate on the fin, as compared to a metal-oxide-semiconductor field effect transistor (MOSFET) with a gate parallel with the plane of the substrate.

Depending on the doping of the source and drain, an n-type FET (NFET) or a p-type FET (PFET) can be formed. An NFET and a PFET can be coupled to form a complementary metal oxide semiconductor (CMOS) device, where a p-channel MOSFET and n-channel MOSFET are coupled together.

With ever decreasing device dimensions, forming the individual components and electrical contacts becomes more difficult. An approach is therefore needed that retains the positive aspects of traditional FET structures, while overcoming the scaling issues created by forming smaller device components, including channel lengths and gate dielectric thicknesses.

SUMMARY

In accordance with an embodiment of the present invention, a method of forming complementary vertical fins and vertical fins with uniform heights is provided. The method includes forming a trench in a region of a substrate, wherein the trench extends through an upper portion of the substrate and a buried punch-through stop layer, and extends into a lower portion of the substrate. The method further includes forming a reformed punch-through stop layer in a bottom portion of the trench. The method further includes forming a fin formation region on the reformed punch-through stop layer, and forming a complementary vertical fin from the fin formation region and a vertical fin from the upper portion of the substrate on a first region of the substrate adjacent to the second region.

In accordance with another embodiment of the present invention, a method of forming complementary vertical fins and vertical fins with uniform heights. The method includes forming a buried punch-through stop layer in a substrate, wherein the buried punch-through stop layer delineates an upper portion of the substrate from a lower portion of the substrate. The method further includes forming a trench in a second region of the substrate, wherein the trench extends through the upper portion of the substrate and buried punch-through stop layer, and extends into the lower portion of the substrate. The method further includes forming a reformed punch-through stop layer in the bottom portion of the trench. The method further includes forming a fin formation region on the reformed punch-through stop layer, and forming complementary vertical fins from the fin formation region and vertical fins from the upper portion of the substrate on a first region of the substrate adjacent to the second region.

In accordance with yet another embodiment of the present invention, a plurality of complementary vertical fins and vertical fins with uniform heights is provided. The plurality of complementary vertical fins and vertical fins with uniform heights includes a substrate, one or more punch-through stop pillars on a first region of the substrate, and one or more complementary punch-through stop pillars on a second region of the substrate adjacent to the first region. The plurality of complementary vertical fins and vertical fins with uniform heights further includes a complementary vertical fin on each of the one or more complementary punch-through stop pillars, wherein each complementary vertical fin is silicon-germanium, and a vertical fin on each of the one or more punch-through stop pillars, wherein each vertical fin is silicon.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention relate generally to forming silicon n-type and silicon-germanium p-type fin field effect transistors (FinFETs) on adjacent regions of a substrate for fabrication of complementary metal-oxide-semiconductor (CMOS) devices with uniform vertical fin heights.

Embodiments of the present invention relate generally to forming a trench in a semiconductor substrate with a buried punch-through stop layer, where the trench extends below the bottom of the buried punch-through stop layer.

Embodiments of the present invention also relate generally to reforming the portion of the buried punch-through stop layer removed by formation of the trench, and epitaxially growing a fin formation region on the reformed punch-through stop layer.

Embodiments of the present invention also relate generally to forming vertical fins from the substrate, fin formation region, buried punch-through stop layer, and reformed punch-through stop layer, so the vertical fins have a uniform height.

Exemplary applications/uses to which the present invention can be applied include, but are not limited to: logic devices.

It is to be understood that aspects of the present invention will be described in terms of a given illustrative architecture; however, other architectures, structures, substrate materials and process features and steps can be varied within the scope of aspects of the present invention.

Figure 1:
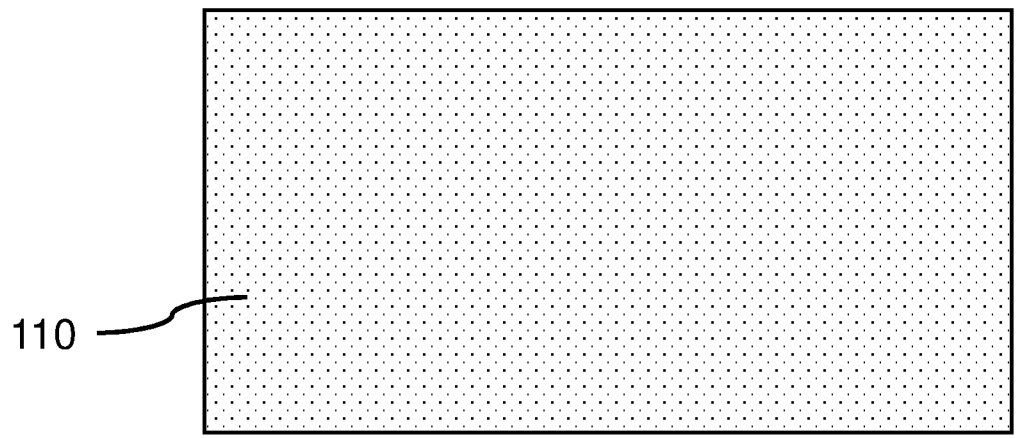
FIG. 1 is a cross-sectional side view showing a substrate, in accordance with an embodiment of the present invention.

Referring now to the drawings in which like numerals represent the same or similar elements and initially to FIG. 1, a substrate is shown, in accordance with an embodiment of the present invention.

In one or more embodiments, a substrate 110 can be a semiconductor or an insulator with an active surface semiconductor layer. The substrate can include a carrier layer that provides mechanical support for other layers of the substrate. The substrate can include crystalline, semi-crystalline, microcrystalline, or amorphous regions. The substrate can be essentially (i.e., except for contaminants) a single element (e.g., silicon), primarily (i.e., with doping) of a single element, for example, silicon (Si) or germanium (Ge), and/or the substrate can include a compound, for example, $A_2O_3$, $SiO_2$, GaAs, SiC, Si:C, or SiGe.

The substrate can also have multiple material layers, for example, a semiconductor-on-insulator substrate (SeOI), such as a silicon-on-insulator substrate (SOI), germanium-on-insulator substrate (GeOI), or silicon-germanium-on-insulator substrate (SGOI). The substrate can also have other layers forming the substrate, including high-k oxides and/or nitrides.

In one or more embodiments, the substrate 110 can be a semiconductor wafer, for example, a silicon wafer. In various embodiments, the substrate can be a single crystal silicon (Si), silicon germanium (SiGe), or III-V semiconductor (e.g., GaAs) wafer, or have a single crystal silicon (Si), silicon germanium (SiGe), or III-V semiconductor (e.g., GaAs) surface/active layer.

Figure 2:
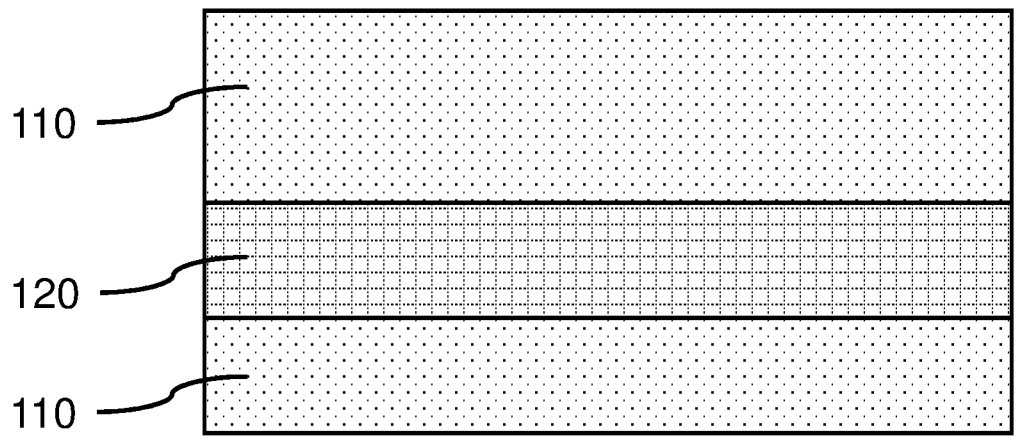
FIG. 2 is a cross-sectional side view showing a buried punch-through stop layer formed in the substrate, in accordance with an embodiment of the present invention.

FIG. 2 is a cross-sectional side view showing a buried punch-through stop layer formed in the substrate, in accordance with an embodiment of the present invention.

In one or more embodiments, a buried punch-through stop layer 120 can be formed within the substrate 110, which can be within an active surface semiconductor layer. The buried punch-through stop layer 120 can delineate an upper portion of the substrate and a lower portion of the substrate, wherein a portion of the substrate 110 is above the buried punch-through stop layer 120. The upper portion of the substrate can have a thickness in the range of about 20 nm to about 80 nm, or in the range of about 30 nm to about 50 nm, although other thicknesses are also contemplated.

The buried punch-through stop layer 120 can be formed by any suitable doping techniques. In various embodiments, the buried punch-through stop layer 120 can be formed by ion implantation, where the implantation can be a blanket implantation. The predetermined dopant can be implanted to a predetermined depth to form the buried punch-through stop layer 120 with a predetermined thickness. The implanted dopant can be annealed to activate the buried punch-through stop layer 120.

In one or more embodiments, a boron dopant can form the buried punch-through stop layer 120, where the dopant is implanted into the substrate. Alternative ways to form the buried punch-through stop layer 120 can include, starting with a substrate (e.g., silicon substrate), epitaxially growing a layer with in-situ doping (e.g., in-situ boron doped silicon epitaxy) to form the buried punch-through stop layer 120, and then epitaxially growing another layer (e.g., silicon without intentional doping) on top of the buried punch-through stop layer 120. The last epitaxy layer can subsequently be used to form vertical fins in a later process.

The doping concentration of the buried punch-through stop layer 120 can be in the range of about $5 \times 10^{17}/cm^3$ to about $2 \times 10^{19}/cm^3$, or in the range of about $2 \times 10^{18}/cm^3$ to about $1 \times 10^{19}/cm^3$ (number of dopant atoms per cubic centimeter).

The buried punch-through stop layer 120 can have a thickness in the range of about 15 nm to about 100 nm, or in the range of about 30 nm to about 60 nm, although other thicknesses are also contemplated.

The top boundary of the buried punch-through stop layer 120 can be about 20 nm to about 80 nm below the surface of the substrate 110, such that the upper portion of the substrate is between the top of the buried punch-through stop layer 120 and a top surface of the substrate 110. The lower portion if the substrate 110 is below the bottom boundary of the buried punch-through stop layer 120.

Figure 3:
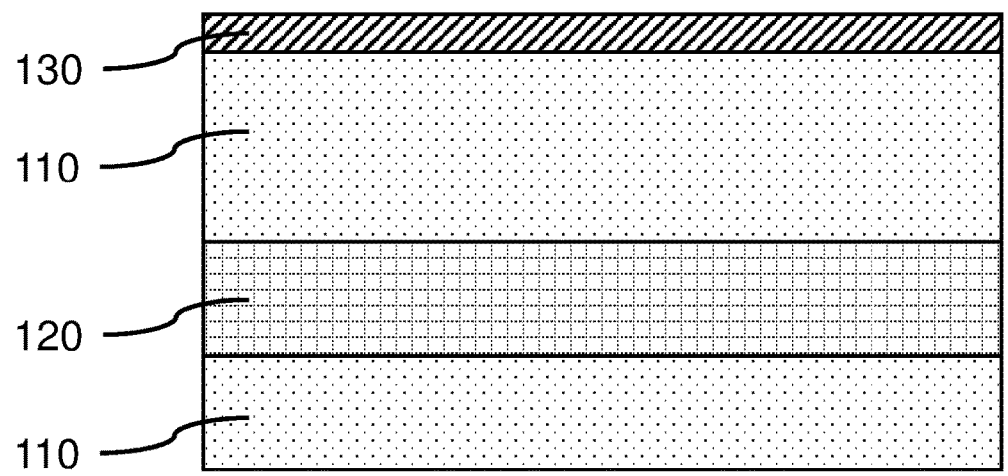
FIG. 3 is a cross-sectional side view showing a fin template layer on the substrate surface, in accordance with an embodiment of the present invention.

FIG. 3 is a cross-sectional side view showing a fin template layer on the substrate surface, in accordance with an embodiment of the present invention.

In one or more embodiments, a fin template layer 130 can be formed on the substrate 110, where the fin template layer 130 can be a hardmask. The fin template layer 130 can be blanket deposited, for example, by CVD or PECVD on the exposed surface of the substrate.

In various embodiments, the fin template layer 130 can be silicon oxide (SiO), silicon nitride (SiN), silicon oxynitride (SiON), silicon carbonitride (SiCN), silicon boronitride (SiBN), silicon carbide (SiC), silicon borocarbide (SiBC), silicon boro carbonitride (SiBCN), boron carbide (BC), boron nitride (BN), or combinations thereof, where the fin template layer 130 may include one or more layers.

Figure 4:
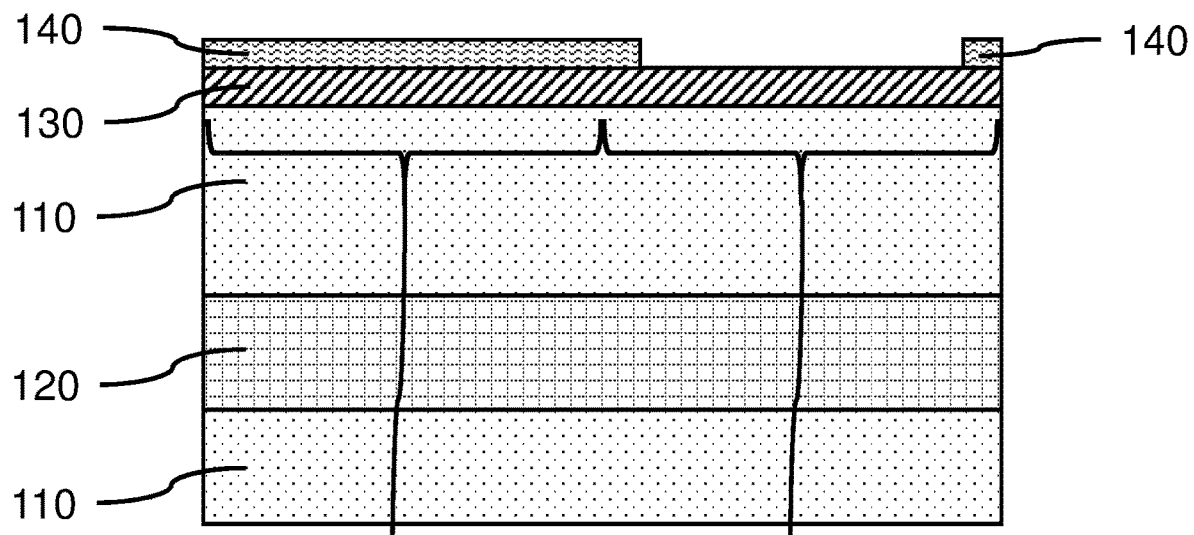
FIG. 4 is a cross-sectional side view showing a patterned masking layer on the fin template layer, in accordance with an embodiment of the present invention.

FIG. 4 is a cross-sectional side view showing a patterned masking layer on the fin template layer, in accordance with an embodiment of the present invention.

In one or more embodiments, a masking layer 140 can be formed and patterned on the fin template layer 130. The masking layer 140 can be a softmask layer, for example, an organic lithography layer, or an extreme ultra violet lithography (EUVL) material that can be patterned and developed to expose a portion of the underlying fin template layer 130. In one or more embodiments, the masking layer 140 can be a positive or negative resist material, for example, Poly (methyl methacrylate) (PMMA) or SU-8, or an electron-beam (e-beam) cured material, for example, hydrogen silsesquioxane (HSQ) that can be suitably patterned. In some embodiment, the masking layer 140 includes a combination of softmask layer and hardmask layer.

The masking layer 140 can be patterned to expose a portion of the fin template layer 130 on a second region 102 of the substrate 110, while the masking layer remains covering the fin template layer 130 on a first region 101 of the substrate.

Figure 5:
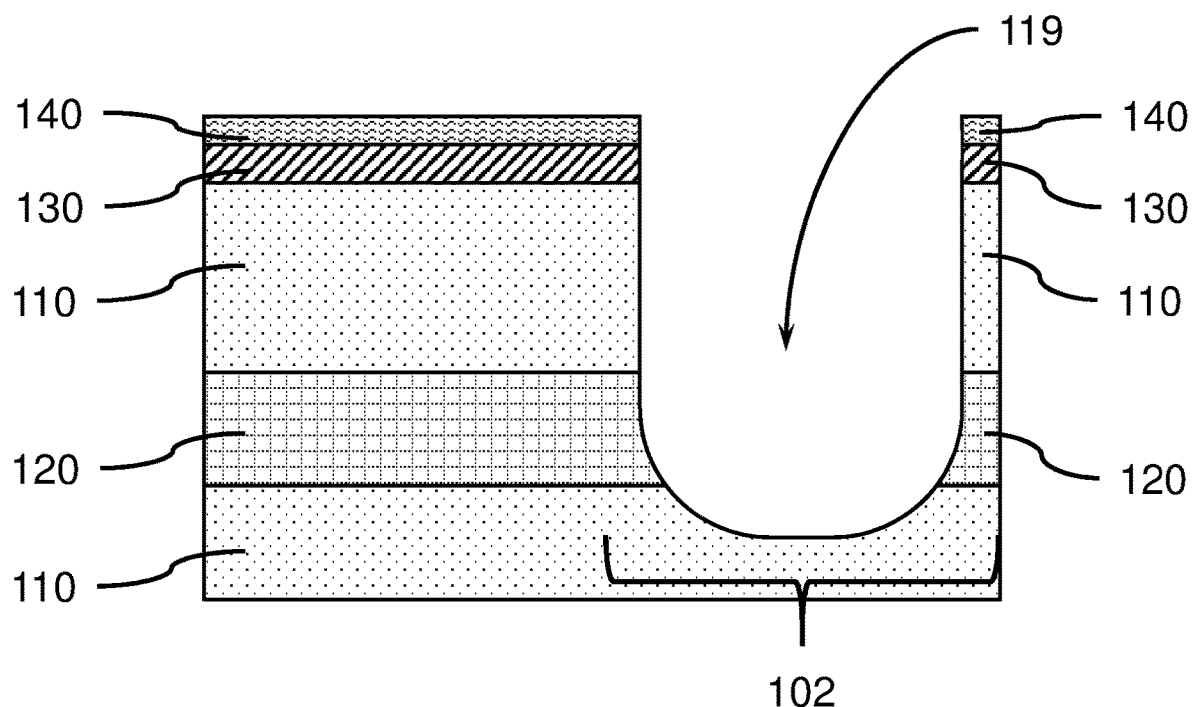
FIG. 5 is a cross-sectional side view showing a trench formed in the substrate and buried punch-through stop layer, in accordance with an embodiment of the present invention.

FIG. 5 is a cross-sectional side view showing a trench formed in the substrate and buried punch-through stop layer, in accordance with an embodiment of the present invention.

In one or more embodiments, the expose a portion of the fin template layer 130 on a second region 102 can be removed to expose the underlying substrate 110. The fin template layer 130 can be removed by a reactive ion etch (RIE).

In one or more embodiments, a trench 119 can be formed in the substrate 110, where the trench extends through the upper portion of the substrate 110 and buried punch-through stop layer 120, and extend into the lower portion of the substrate. The trench 119 can interrupt the buried punch-through stop layer 120 in the second region 102. The trench 119 can have rounded portion at the bottom, where the corners are rounded. The trench 119 can be formed by a selective, directional etch, for example, a reactive ion etch that selectively removes the substrate material.

In various embodiments, the trench 119 can have a depth in the range of about 50 nm to about 180 nm, or in the range of about 70 nm to about 100 nm, although other depths are contemplated. The trench 119 can be significantly deeper than a predetermined vertical fin height, so the rounded portions of the trench are below the adjacent top interface of the buried punch-through stop layer 120 with the upper portion of the substrate 110. The rounded portions may be within and/or below the buried punch-through stop layer 120 and lower portion of the substrate.

Figure 6:
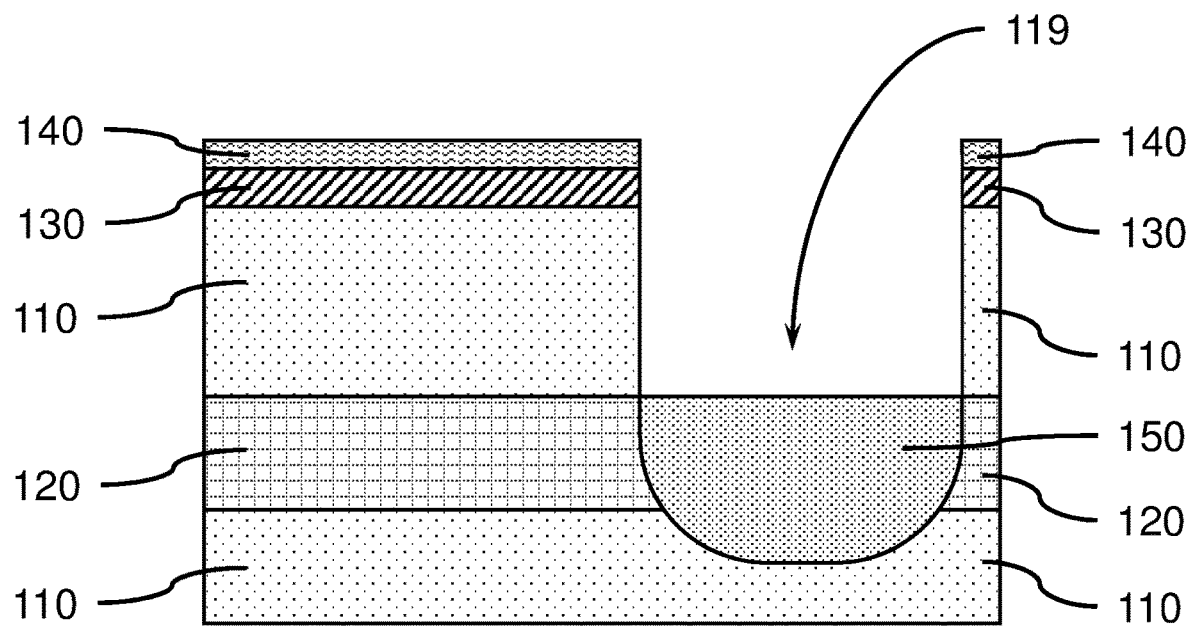
FIG. 6 is a cross-sectional side view showing a reformed punch-through stop layer formed in the trench, in accordance with an embodiment of the present invention.

FIG. 6 is a cross-sectional side view showing a reformed punch-through stop layer formed in the trench, in accordance with an embodiment of the present invention.

In one or more embodiments, a reformed punch-through stop layer 150 can be formed in the trench 119, where the reformed punch-through stop layer 150 can be formed on the exposed substrate 110 and fill a portion of the trench 119 to a height equal to or greater than the top interface of the buried punch-through stop layer 120 with the upper portion of the substrate 110. If the height of the reformed punch-through stop layer 150 is greater than the top interface of the buried punch-through stop layer 120 with the upper portion of the substrate 110, an etch-back process can be used to reduce the height of the reformed punch-through stop layer 150 to be approximately equal with the top interface of the buried punch-through stop layer 120 with the upper portion of the substrate 110.

In some embodiments, the reformed punch-through stop layer 150 can be formed to a height above the top surface of the substrate 110. If so, the overgrown portion can be removed by a planarization process such as chemical mechanical polishing (CMP) followed by an etch-back process such as RIE.

In one or more embodiments, an arsenic, antimony, or phosphorus dopant can be used to dope the reformed punch-through stop layer 150, where the dopant can be incorporated into the reformed punch-through stop layer 150 in situ (during layer formation) or ex situ (after layer formation) through implantation. Any suitable doping techniques can be used, including, but not limited to, ion implantation and plasma doping, to dope the reformed punch-through stop layer 150.

The doping concentration of the reformed punch-through stop layer 120 can be in the range of about $5 \times 10^{17}/cm^3$ to about $2 \times 10^{19}/cm^3$, or in the range of about $2 \times 10^{18}/cm^3$ to about $1 \times 10^{19}/cm^3$.

The reformed punch-through stop layer 150 can have a thickness in the range of about 15 nm to about 100 nm, or in the range of about 30 nm to about 60 nm, although other thicknesses are also contemplated. The reformed punch-through stop layer 150 can be thicker than the buried punch-through stop layer 120, where the reformed punch-through stop layer 150 can extend into the lower portion of the substrate 110.

Figure 7:
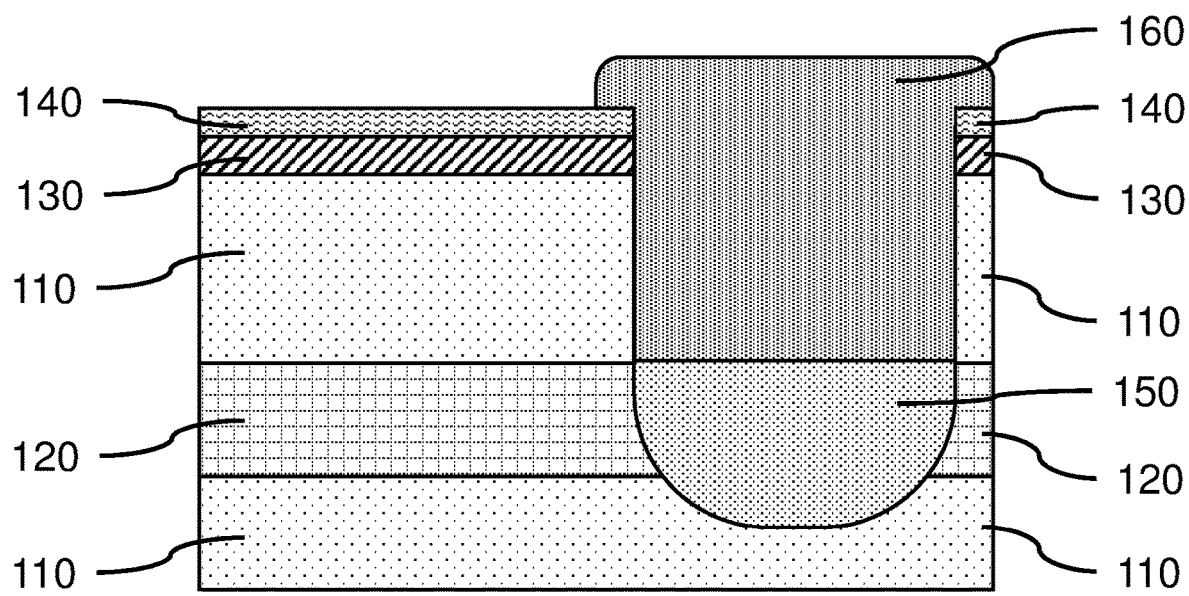
FIG. 7 is a cross-sectional side view showing a fin formation region on the reformed punch-through stop layer, in accordance with an embodiment of the present invention.

FIG. 7 is a cross-sectional side view showing a fin formation region on the reformed punch-through stop layer, in accordance with an embodiment of the present invention.

In one or more embodiments, the fin formation region 160 can be formed on the reformed punch-through stop layer 150. The fin formation region 160 can be formed by epitaxial growth on the reformed punch-through stop layer 150, where the fin formation region 160 can have the same crystal orientation as the reformed punch-through stop layer 150. The fin formation region 160 can extend above the top surface of the masking layer 140 and/or fin template layer 130 if the masking layer 140 was previously removed or if the masking layer 140 is a hardmask layer.

In various embodiments, the reformed punch-through stop layer 150 and the fin formation region 160 can be epitaxially grown consecutively in the same epitaxy growth chamber.

The fin formation region 160 can be single crystal silicon (Si) or single crystal silicon-germanium (SiGe) with the same crystal orientation as the reformed punch-through stop layer 150 on which the fin formation region is grown. In various embodiments, the fin formation region 160 can be an intrinsic semiconductor material.

In various embodiments, the fin formation region 160 can be silicon-germanium ($Si_xGe_{1-x}$), where the fin formation region material can have a germanium concentration in the range of about 10 at. % Ge to about 85 at. % Ge, or in the range of about 20 at. % Ge to about 60 at. % Ge, or about 30 at. % Ge to about 50 at. % Ge. (at. %=atomic percent).

Figure 8:
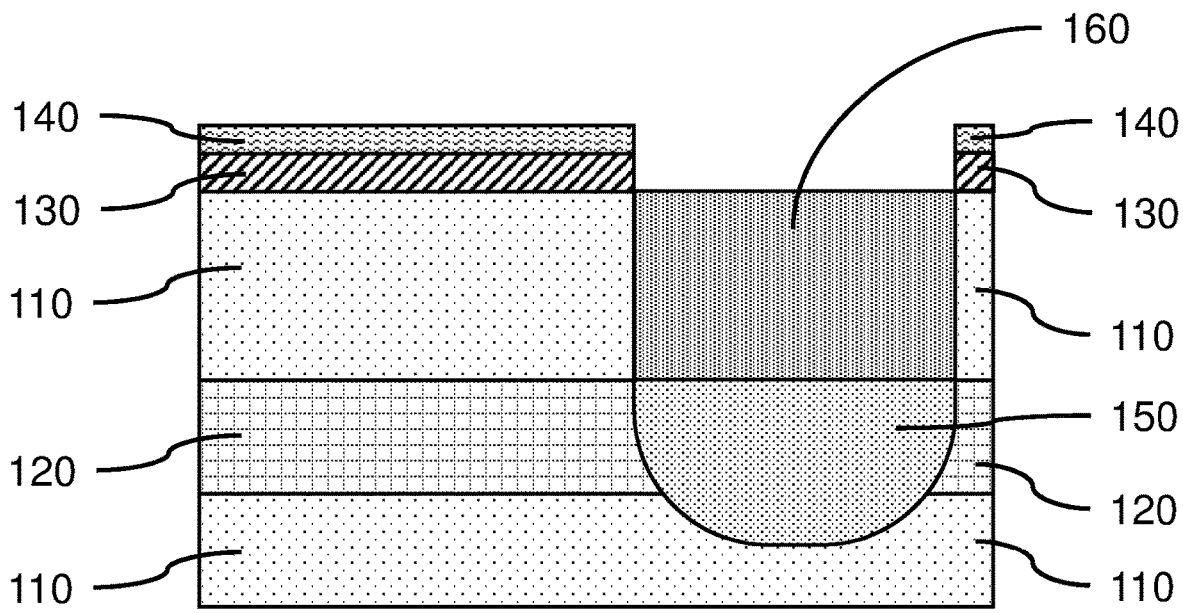
FIG. 8 is a cross-sectional side view showing a recessed fin formation region, in accordance with an embodiment of the present invention.

FIG. 8 is a cross-sectional side view showing a recessed fin formation region, in accordance with an embodiment of the present invention.

In one or more embodiments, the portion of the fin formation region 160 extending above the top surface of the masking layer 140 and/or fin template layer 130 can be removed using a chemical-mechanical polishing (CMP) to provide a smooth flat surface. A selective etch (e.g., RIE) can be used to etch back the fin formation region 160 below the masking layer 140 and/or fin template layer 130 to recess the fin formation region 160 below the top surface.

Figure 9:
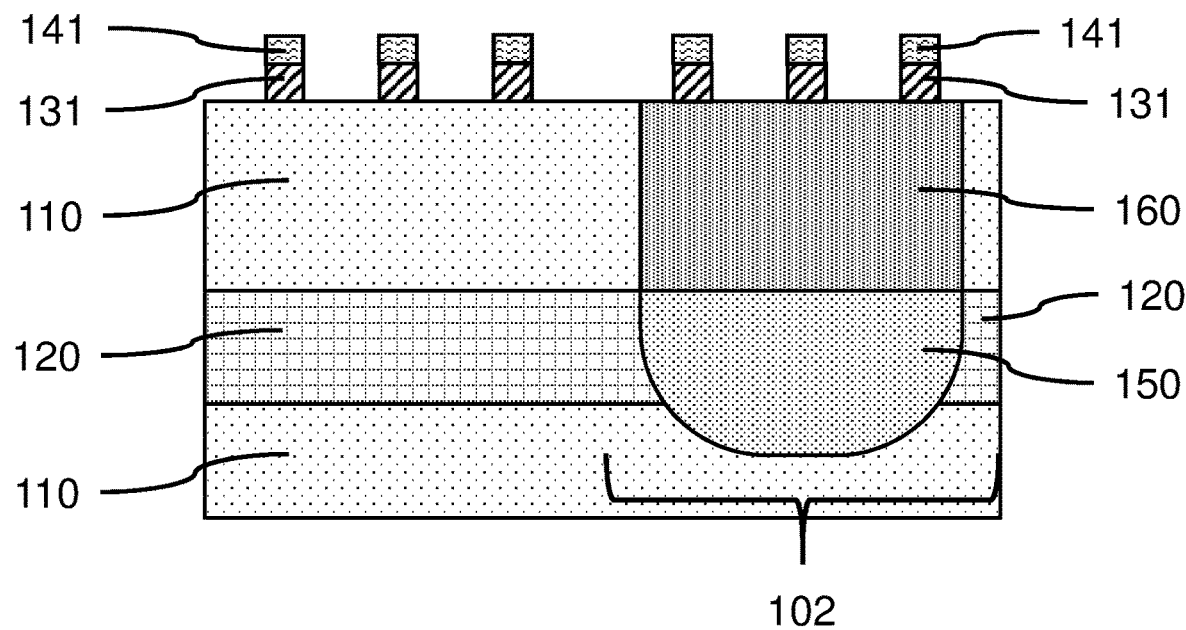
FIG. 9 is a cross-sectional side view showing mask segments and fin templates on the substrate and fin formation region, in accordance with an embodiment of the present invention.

FIG. 9 is a cross-sectional side view showing mask segments and fin templates on the substrate and fin formation region, in accordance with an embodiment of the present invention.

In one or more embodiments, the masking layer 140 and underlying fin template layer 130 can be removed to expose the top surface of the substrate 110 and the fin formation region 160. A second fin template layer can be formed on the top surface of the substrate 110 and the fin formation region 160, and a second masking layer can be formed on the second fin template layer.

In one or more embodiments, the second masking layer can be patterned and developed to form one or more mask segments 141 on the underlying second fin template layer. The exposed portion of the second fin template layer can be removed, for example, by RIE, to form one or more fin templates 131 below each of the one or more mask segments 141. The patterning of the mask segments 141 and fin templates 131 can be done by any suitable patterning technique, including, but not limited to, lithography, sidewall image transfer (SIT), self-aligned double patterning (SADP), and self-aligned quadruple patterning (SAQP).

Figure 10:
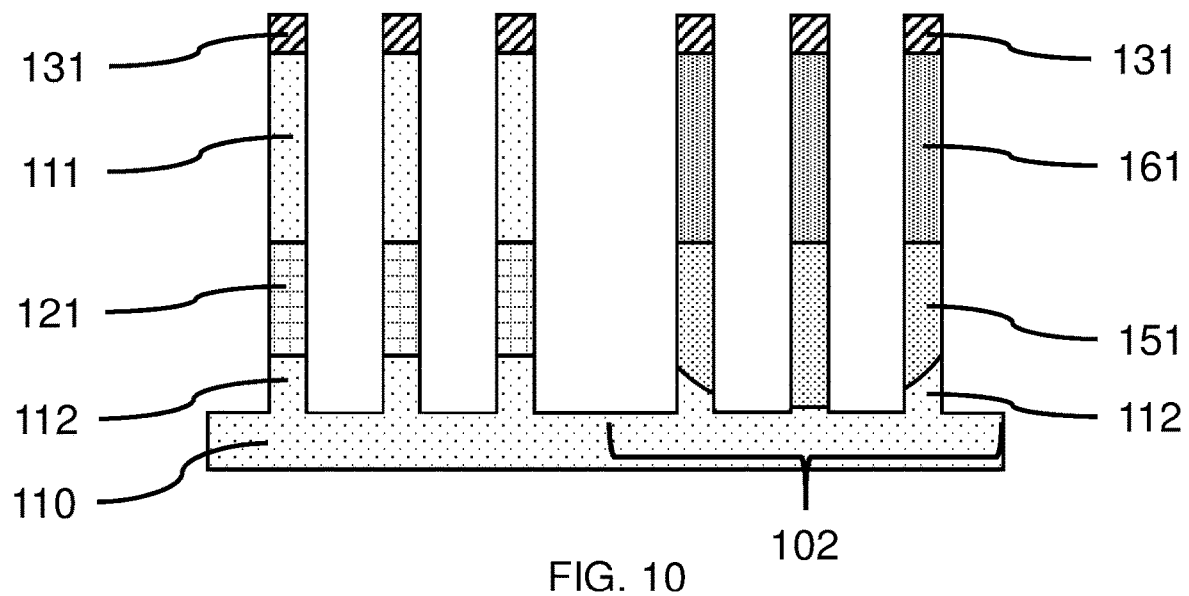
FIG. 10 is a cross-sectional side view showing mask segments and fin templates on vertical fins and punch-through stops on adjacent regions of the substrate, in accordance with an embodiment of the present invention.

FIG. 10 is a cross-sectional side view showing mask segments and fin templates on vertical fins and punch-through stops on adjacent regions of the substrate, in accordance with an embodiment of the present invention.

In one or more embodiments, the fin templates 131 can be used to mask portions of the underlying substrate 110 and fin formation region 160, where the fin formation region 160 is on a second region 102 of the substrate 110. Portions of the underlying substrate 110 and fin formation region 160 exposed between fin templates 131 can be removed, for example, by a directional selective etch, such as a reactive ion etch (RIE), to form one or more vertical fins 111 from the underlying substrate 110 and one or more complementary vertical fins 161 from the fin formation region 160, where the complementary vertical fins 161 extend vertically away from the reformed punch-through stop layer 150.

Portions of the reformed punch-through stop layer 150 can be removed from between the complementary vertical fins 161 to form complementary punch-through stop pillars 151 below each of the complementary vertical fins 161. Portions of the buried punch-through stop layer 120 can be removed from between the vertical fins 111 to form punch-through stop pillars 121 below each of the vertical fins 111. The punch-through stop pillars 121 and complementary punch-through stop pillars 151 can be on the lower portion of the substrate 110, where the lower portion of the substrate can be partially removed to form extension regions 112 below the punch-through stop pillars 121 and complementary punch-through stop pillars 151.

In various embodiments, there may be a larger distance between a complementary vertical fin 161 and an adjacent vertical fin 111 than between complementary vertical fins 161 or vertical fins 111.

In various embodiments, a plurality of vertical fins 111 and complementary vertical fins 161 can be formed by a sidewall image transfer (SIT) process, self-aligned double patterning (SADP) process, or self-aligned quadruple patterning (SAQP) process, to provide a tight pitch between vertical fins 111 and complementary vertical fins 161. In various embodiments, a direct print can be used to provide fin templates from a fin template layer. Immersion Lithography can direct print down to about 78 nm pitch. Extreme ultraviolet lithography (also known as EUV or EUVL), considered a next-generation lithography technology using an extreme ultraviolet (EUV) wavelength, can direct print down to a pitch smaller than 50 nm. Self-aligned double patterning (SADP) can achieve down to about 40 nm to 60 nm fin pitch. Self-aligned quadruple patterning (SAQP) may be used to go down to below 40 nm fin pitch. These other processes are also contemplated, and the scope of the claims and invention should not be limited to the particular illustrated features.

In one or more embodiments, the vertical fins 111 and complementary vertical fins 161 can be formed at the same time, where the vertical fins 111 and complementary vertical fins 161 can be formed by a directional etch (e.g., RIE).

In various embodiments, the gaps between adjacent vertical fins can have different depths, where there can be a deeper gap at the boundary between reformed punch-through stop layer 150 and buried punch-through stop layer 120, and gaps that are shallower than the bottom of reformed punch-through stop layer 150 and buried punch-through stop layer 120 between vertical fins in the same region 101, 102.

The mask segments 141 can be removed, for example, by ashing or stripping after formation of the vertical fins 111 and complementary vertical fins 161. The fin templates 131 can remain on the vertical fins 111 and complementary vertical fins 161.

Figure 11:
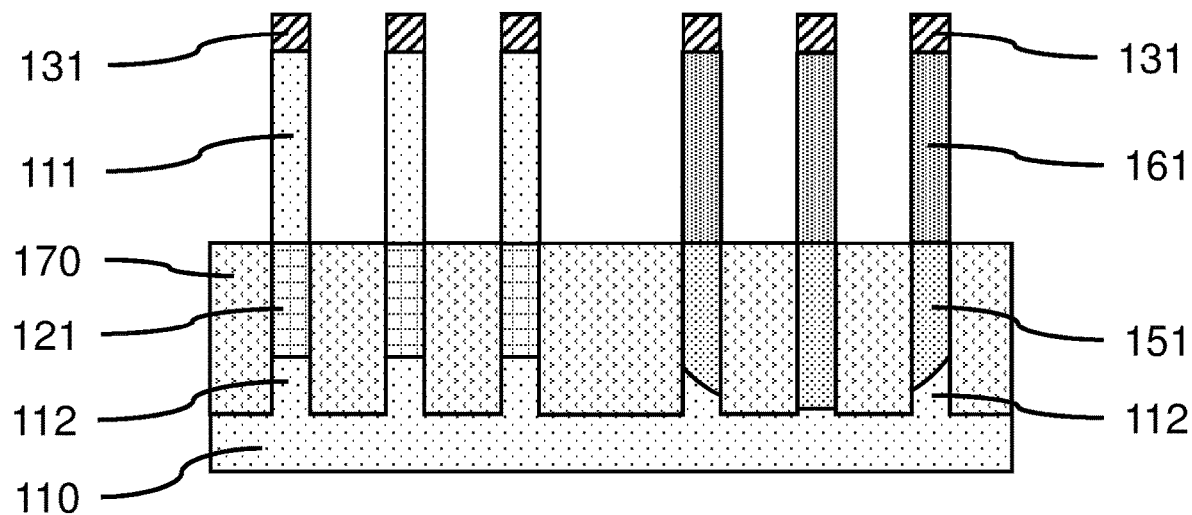
FIG. 11 is a cross-sectional side view showing an isolation layer on the substrate and punch-through stops, in accordance with an embodiment of the present invention.

FIG. 11 is a cross-sectional side view showing an isolation layer on the substrate and punch-through stops, in accordance with an embodiment of the present invention.

In one or more embodiments, an isolation layer 170 can be formed on the punch-through stop pillars 121, vertical fins 111, complementary vertical fins 161, and complementary punch-through stop pillars 151. The isolation layer 170 can be formed by a blanker deposition, for example, chemical vapor deposition (CVD), plasma enhanced chemical vapor deposition (PECVD) spin-on coating, a conformal deposition, for example, atomic layer deposition (ALD), or a combination thereof. The isolation layer 170 can extend above the fin templates 131 and a CMP and etch-back process can be used to reduce the height of the isolation layer 170. The top surface of the isolation layer can be recessed to be approximately even with the tops of the punch-through stop pillars 121 and complementary punch-through stop pillars 151, so the vertical fins 111 and complementary vertical fins 161 can be above the isolation layer 170.

In one or more embodiments, the isolation layer 170 can be a silicon oxide (SiO), a silicon nitride (SiN), a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), a low-K dielectric material, or a combination thereof. A low-k dielectric material can include, but not be limited to, a fluoride-doped silicon oxide (e.g., fluoride doped glass), a carbon doped silicon oxide, a porous silicon oxide, a spin-on silicon based polymeric material (e.g., tetraethyl orthosilicate (TEOS), hydrogen silsesquioxane (HSQ) and methylsilsesquioxane (MSQ)), or combinations thereof. The isolation layer can electrically insulate the adjacent fins to electrically separate later formed devices.

In various embodiments, by forming the vertical fins 111 and complementary vertical fins 161, at the same time, where the complementary vertical fins 161 are formed from the fin formation region 160 on the reformed punch-through stop layer 150, can minimize the fin height variation due to the corner rounding of the trench 119. By forming the reformed punch-through stop layer 150 in the bottom portion of the trench, the reformed punch-through stop layer 150 fills the rounded portion and provides a controlled surface for forming the complementary vertical fins 161 even though the complementary punch-through stop pillars 151 are not a uniform height. The punch-through stop pillars 121 can have a uniform height. The complementary punch-through stop pillars 151 can have a non-uniform height, where the distance from an extension region 112 or the substrate 110 can vary based on the curvature of the bottom of the reformed punch-through stop layer 150 due to the trench formation. The complementary punch-through stop pillars 151 formed on the rounded portions of the reformed punch-through stop layer 150 include less punch-through stop material and taller extension regions 112, compared to the complementary punch-through stop pillars 151 formed on a flatter central region of the reformed punch-through stop layer 150. The extension regions 112 can also have curved or sloped top surfaces at the interface with the complementary punch-through stop pillars 151. Complementary punch-through stop pillars 151 formed on the flatter portion of the trench 119 can have a more uniform distance between the top and bottom surfaces. The complementary vertical fin 161 on each of the one or more complementary punch-through stop pillars 151 and the vertical fin 111 on each of the one or more punch-through stop pillars 121 can have approximately (i.e., within fabrication and measurement tolerances) the same height.

In a non-limiting exemplary embodiment, the complementary vertical fins 161 are silicon-germanium, and the complementary punch-through stop pillars 151 are arsenic-doped silicon, phosphorus-doped silicon, arsenic-doped silicon-germanium, or phosphorus-doped silicon-germanium. In some embodiments, the complementary punch-through stop pillars 151 may further include carbon. The vertical fins are silicon, and the punch-through stop pillars 121 are boron-doped silicon or gallium-doped silicon. In some embodiments, the punch-through stop pillars 121 may further include carbon.

Figure 12:
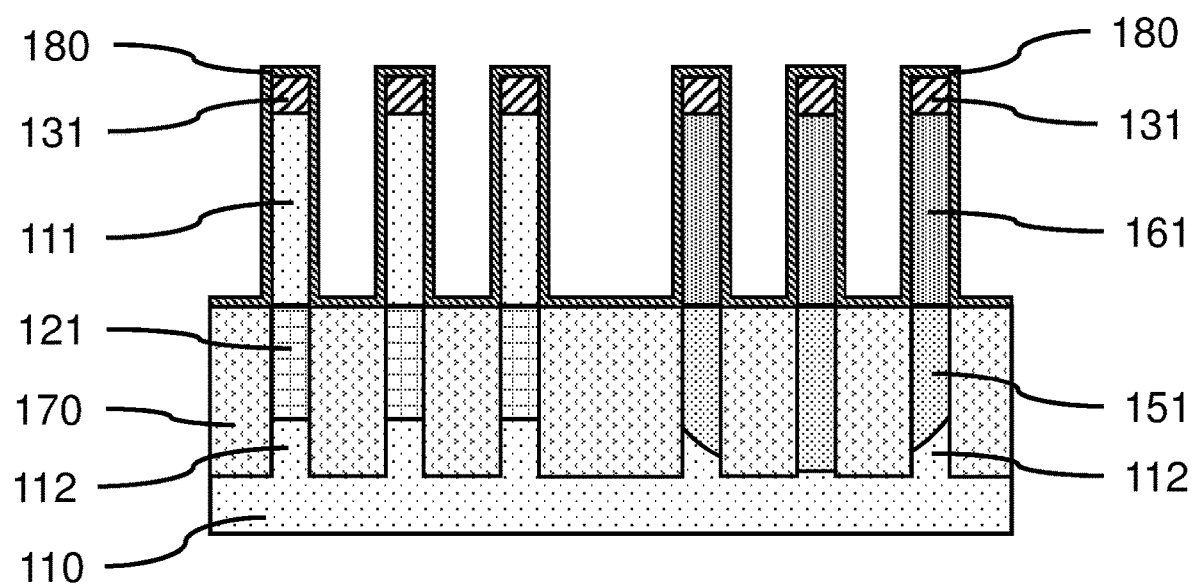
FIG. 12 is a cross-sectional side view showing a gate dielectric layer on the isolation layer, vertical fins, and fin templates, in accordance with an embodiment of the present invention.

FIG. 12 is a cross-sectional side view showing a gate dielectric layer on the isolation layer, vertical fins, and fin templates, in accordance with an embodiment of the present invention.

In one or more embodiments, a gate dielectric layer 180 can be formed on the exposed surfaces of the isolation layer 170, vertical fins 111, and complementary vertical fins 161, where the gate dielectric layer 180 can be conformally deposited (e.g., by ALD, PEALD, CVD).

In one or more embodiments, the gate dielectric layer 180 can be an insulating dielectric layer, for example, a silicon oxide (SiO), silicon nitride (SiN), silicon oxynitride (SiON), a high-K dielectric (i.e., a material having a dielectric constant greater than $SiO_2$), or a suitable combination of these materials.

Figure 13:
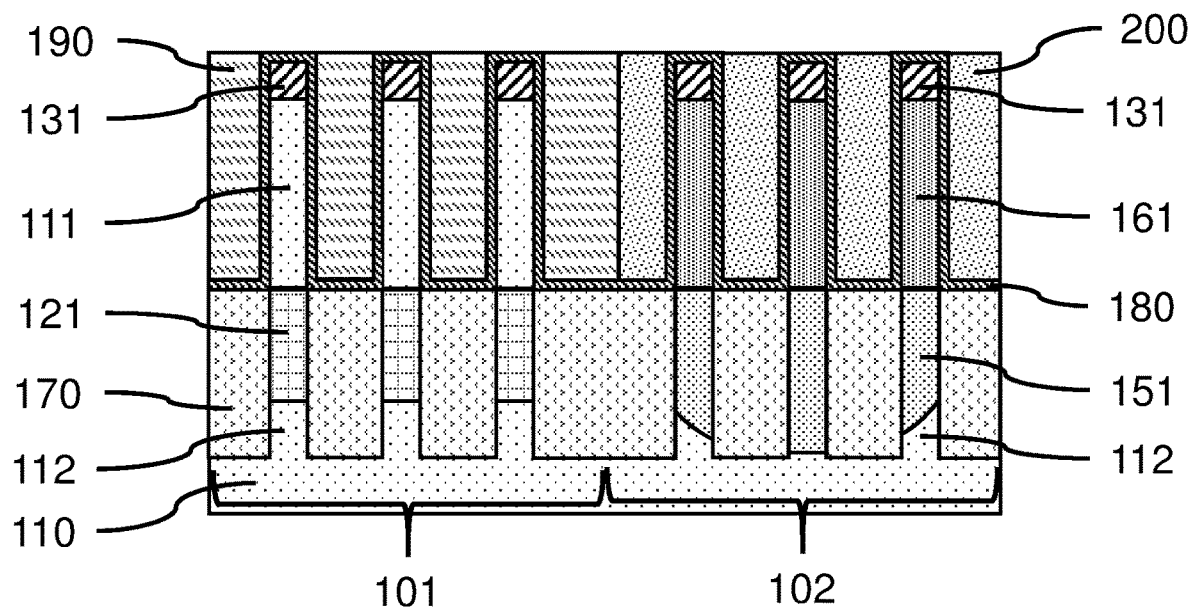
FIG. 13 is a cross-sectional side view showing a blocking layer on a first subset of vertical fins and a gate electrode on a second subset of vertical fins, in accordance with an embodiment of the present invention.

FIG. 13 is a cross-sectional side view showing a blocking layer on a first subset of vertical fins and a gate electrode on a second subset of vertical fins, in accordance with an embodiment of the present invention.

In one or more embodiments, a blocking layer 190 can be formed on the gate dielectric layer 180. The blocking layer 190 can be masked and a portion of the blocking layer removed to expose the gate dielectric layer 180 on the complementary vertical fins 161 on the second region 102 of the substrate 110, while remaining on the first region 101.

In one or more embodiments, a conductive gate electrode 200 can be formed on the gate dielectric layer 180 on the second region 102 to form a gate structure with the gate dielectric layer 180. The gate electrode can be a work function layer on the gate dielectric layer 180 and a conductive gate fill on the work function layer. The work function layer may be suitable for a p-type FinFET on the complementary vertical fins 161. In various embodiments, the work function layer can be optional. The conductive gate fill can be a metal (e.g., tungsten (W), cobalt (Co), titanium (Ti), etc.) a conductive carbon (e.g. graphene, carbon nanotubes, etc.), or an amorphous silicon (a-Si), or suitable combinations thereof.

In one or more embodiments, the conductive gate fill layer can be blanket deposited, and a chemical-mechanical polishing (CMP) used to remove gate fill layer material that extends above the top surfaces of the fin templates 131 or gate dielectric layer 180.

Figure 14:
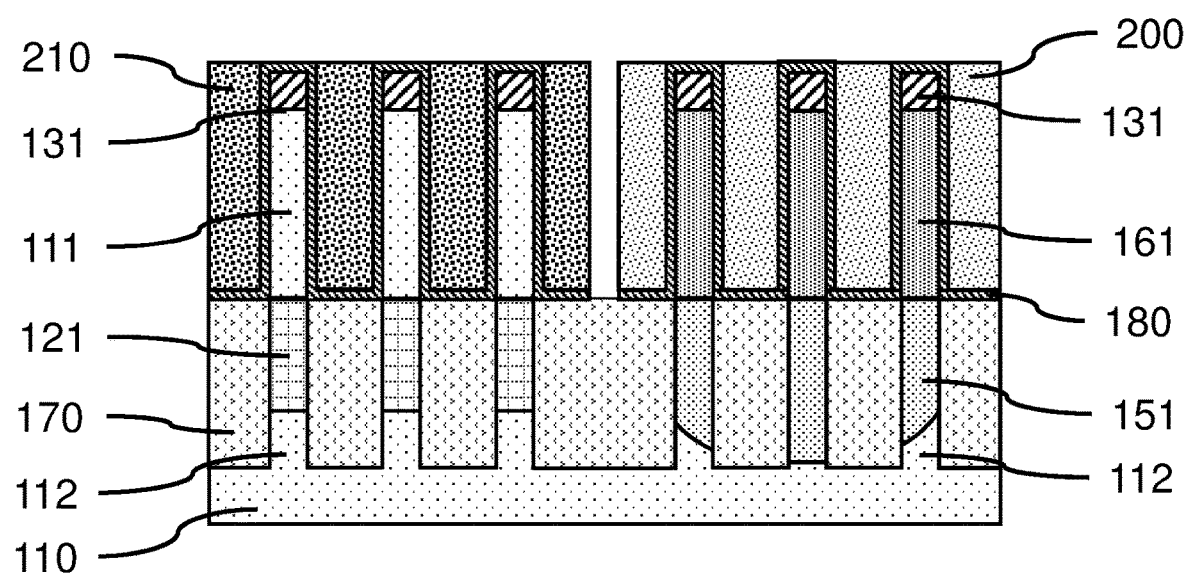
FIG. 14 is a cross-sectional side view showing NFETs on a first region of the substrate and PFETs on an adjacent second region of the substrate, in accordance with an embodiment of the present invention.

FIG. 14 is a cross-sectional side view showing NFETs on a first region of the substrate and PFETs on an adjacent second region of the substrate, in accordance with an embodiment of the present invention.

In one or more embodiments, the blocking layer 190 can be removed and a conductive gate electrode 210 can be formed on the gate dielectric layer 180 on the first region 101 to form a gate structure with the gate dielectric layer 180. The gate electrode can be a work function layer on the gate dielectric layer 180 and a conductive gate fill on the work function layer. The work function layer may be suitable for an n-type FinFET on the vertical fins 111. In various embodiments, the work function layer can be optional.

In one or more embodiments, a work function layer can be formed on the exposed surfaces of the gate dielectric layer 180, where the work function layer can be conformally deposited by ALD, PEALD, CVD, PECVD, or combinations thereof.

In one or more embodiments, the work function layer can adjust the electrical properties of a gate electrode. Different work function layers can be formed for the NFETs and PFETs, respectively.

The conductive gate fill layer can fill in the space between vertical fins 111 or complementary vertical fins 161. The gate fill layer, gate dielectric layer 180, and optionally the work function layer, can form a gate structure on one or more vertical fin(s) 111 or complementary vertical fins 161, where the gate fill layer and work function layer 165 can form a conductive gate electrode.

In one or more embodiments, the gate fill layer 170 can be blanket deposited, and a chemical-mechanical polishing (CMP) used to remove gate fill layer material that extends above the top surfaces of the fin templates 141, gate dielectric layer 160 and/or work function layer 165 if present, where the CMP can provide a smooth, flat surface. Gates can be formed by any other suitable techniques such as replacement metal gate (RMG) processes, gate-first processes, or hybrid of gate-first and RMG processes.

In one or more embodiments, a source/drain segment can be formed on the surface of each vertical fin 111 and/or complementary vertical fin 161, where the source/drain segment can be epitaxially grown on the exposed surface. The source/drain segments (not shown) are in to and out of the plane of the figure. Additional device structures, for example, spacers and contacts, are also known in the art, and not shown for clarity.

In one or more embodiments, the source/drain segments can be suitably doped to form an n-type field effect transistor (NFET) (e.g., phosphorus, arsenic, antimony, or combinations thereof), or a p-type field effect transistor (PFET) (e.g., boron, gallium, indium, or combinations thereof).

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or including, when used herein, specify the presence of stated features, integers, steps, operations, elements and/or components, but do not preclude the presence or addition of one or ore other features, integers, steps, operations, elements, components and/or groups thereof.

Spatially relative terms, such as "beneath," "below," "lower," "above" "upper," and the like, can be used herein for ease of description to describe one element's or feature's relationship to another element(s) or feature(s) as illustrated in he FIGS. It will be understood that the spatially relative terms are intended to encompass different orientations of the device in use or operation in addition to the orientation depicted in the FIGS. For example, if the device in the FIGS. is turned over, elements described as "below" "beneath" other elements or features would then be oriented "above" the other elements or features. Thus, the term "below" can encompass both an orientation of above and below. The device can be otherwise oriented (rotated 90 degrees or at other orientations),and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A plurality of complementary vertical fins and vertical fins with uniform heights, comprising:
   a substrate;
   one or more punch-through stop pillars on a first region of the substrate;
   one or more complementary punch-through stop pillars on a second region of the substrate adjacent to the first region, wherein the complementary punch-through stop pillars are different heights;

a complementary vertical fin on each of the one or more complementary punch-through stop pillars; and a vertical fin on each of the one or more punch-through stop pillars.

2. The plurality of complementary vertical fins and vertical fins of claim 1, wherein the material of the one or more punch-through stop pillars is selected from the group consisting of arsenic-doped silicon, phosphorus-doped silicon, arsenic-doped silicon-germanium, and phosphorus-doped silicon-germanium.

3. The plurality of complementary vertical fins and vertical fins of claim 2, wherein each complementary vertical fin is silicon-germanium.

4. The plurality of complementary vertical fins and vertical fins of claim 1, wherein the material of the one or more complementary punch-through stop pillars is selected from the group consisting of boron-doped silicon and gallium-doped silicon.

5. The plurality of complementary vertical fins and vertical fins of claim 4, wherein each vertical fin is silicon.

6. The plurality of complementary vertical fins and vertical fins of claim 1, wherein the punch-through stop pillars have a uniform height.

7. The plurality of complementary vertical fins and vertical fins of claim 6, wherein the vertical fins and complementary vertical fins have approximately the same height.

8. The plurality of complementary vertical fins and vertical fins of claim 6, wherein each of the one or more complementary punch-through stop pillars is on an extension region.

9. A plurality of complementary vertical fins and vertical fins with uniform heights, comprising:
   a substrate;
   one or more punch-through stop pillars on a first region of the substrate;
   one or more complementary punch-through stop pillars on a second region of the substrate adjacent to the first region, wherein the complementary punch-through stop pillars are different height;
   a complementary vertical fin on each of the one or more complementary punch-through stop pillars, wherein each complementary vertical fin is silicon-germanium; and
   a vertical fin on each of the one or more punch-through stop pillars, wherein each vertical fin is silicon.

10. The plurality of complementary vertical fins and vertical fins of claim 9, wherein the complementary vertical fin on each of the one or more complementary punch-through stop pillars has a germanium concentration in the range of about 10 at. % Ge to about 85 at. % Ge.

11. The plurality of complementary vertical fins and vertical fins of claim 9, wherein the complementary vertical fin on each of the one or more complementary punch-through stop pillars and the vertical fin on each of the one or more punch-through stop pillars have approximately the same height.

12. The plurality of complementary vertical fins and vertical fins of claim 11, further comprising an isolation layer on the one or more complementary punch-through stop pillars and the one or more punch-through stop pillars.

13. The plurality of complementary vertical fins and vertical fins of claim 12, further comprising a gate structure on each vertical fin, and a gate structure on each complementary vertical fin.

14. A plurality of complementary vertical fins and vertical fins with uniform heights, comprising:
   six or more extension regions on a substrate, wherein at least three extension regions are on a first region of the substrate and at least three extension regions are on a second region of the substrate adjacent to the first region;
   a punch-through stop pillar on each of the at least three extension regions on the first region of the substrate; and
   a complementary punch-through stop pillar on each of the at least three extension regions are on the second region of the substrate, wherein the complementary punch-through stop pillars are not a uniform height.

15. The plurality of complementary vertical fins and vertical fins with uniform heights of claim 14, wherein the extension regions below the complementary punch-through stop pillars have curved or sloped top surfaces at the interface with the complementary punch-through stop pillars.

16. The plurality of complementary vertical fins and vertical fins with uniform heights of claim 15, further comprising a complementary vertical fin on each of the one or more complementary punch-through stop pillars, and a vertical fin on each of the one or more punch-through stop pillars.

17. The plurality of complementary vertical fins and vertical fins with uniform heights of claim 16, wherein the vertical fins and complementary vertical fins have approximately the same height.

18. The plurality of complementary vertical fins and vertical fins with uniform heights of claim 17, wherein the dopant concentration of the punch-through stop pillars are in the range of about $5\times10^{17}/cm^3$ to about $2\times10^{19}/cm^3$, and the dopant concentration of the complementary punch-through stop pillars are in the range of about $5\times10^{17}/cm^3$ to about $2\times10^{19}/cm^3$.

* * * * *